United States Patent Office 3,495,987

Patented Feb. 17, 1970

3,495,987

PHOTOPOLYMERIZABLE PRODUCTS

Elizabeth Mary Moore, Vienna, W. Va., assignor to E. I. du Pont de Nemours and Company, Wilmington, Del., a corporation of Delaware

No Drawing. Filed Sept. 3, 1965, Ser. No. 485,129
Int. Cl. G03c *1/70, 5/00*
U.S. Cl. 96—115 9 Claims

ABSTRACT OF THE DISCLOSURE

A photopolymerizable composition comprising (a) an addition polymerizable ethylenically unsaturated compound having at least one terminal ethylenic group, having a boiling point above 100° C. at normal atmospheric pressure, and being capable of forming a high polymer by photoinitiated addition polymerization, and (b) an addition polymerization initiating combination of (1) a radiation-sensitive compound absorbs actinic radiation and is raised to an active state, and (2) an organic bromine donor compound that produces free radicals upon being initiated by said radiation-sensitive compound.

The compositions polymerize rapidly and can be made sensitive to the whole visible spectrum.

This invention pertains to photopolymerization. More particularly, it relates to new compositions, layers and elements embodying such layers having increased rates of polymerization.

Photopolymerization of vinyl monomers is well known and elements useful for such a process have been disclosed in a number of references, e.g., U.S. patents numbered 2,760,863; 3,060,023; 3,060,026, etc. The speed or sensitivity to actinic radiation of these elements has been adequate for various uses, but more efficient initiation of the polymerization reaction is desirable for a more sensitive element, e.g., a projection speed element useful for exposure by a relatively low intensity radiation source at relatively short exposure times.

It is an object of the present invention to provide photopolymerizable compositions, layers and elements of increased sensitivity to longer wave length radiation, e.g., to radiation in the visible spectrum, and more particularly to longer length visible radiation such as green and red light. Yet another object is to increase the quantum efficiency of the photochemical reaction, i.e., to increase the number of propagating radicals obtained per photon of absorbed radiation. Still other objects will become apparent to one skilled in the art from the following description of the invention.

The above objects are attained by the photopolymerizable compositions, layers and elements of this invention. The compositions and layers of this invention comprise a uniform mixture of:

(a) An addition polymerizable ethylenically unsaturated compound having at least one terminal ethylenic group, having a boiling point above 100° C. at normal atmospheric pressure, and being capable of forming a high polymer by photoinitiated addition polymerization, and (b) An addition polymerization initiating combination of (1) A radiation-sensitive compound that absorbs actinic radiation (e.g., light of wavelength within the ultraviolet or visible region of the spectrum) and is raised to an active state, and (2) An organic bromine donor compound that produces free radicals upon being initiated by said radiation-sensitive compound, and, if desired, at least one of the following adjuvants:

(c) A polymeric organic binding agent that forms solid, coherent films, (d) A normally liquid or solid amine reducing agent, and (e) A hydrogen donor compound.

Mixtures of two or more of each of the compounds listed above can be used in the photopolymerizable layers.

Radiation-sensitive compound (1) is preferably a mono- or polymethine photographic sensitizing dye but can be a photoreducible dye including the dyes disclosed in Oster U.S. Patent 2,875,047.

Compound (a) may, if polymeric in nature, serve also as compound (c). For every 100 parts of compound (a) there may be present 0.01 to 10 parts of compound (1), 0.1 to 10 parts of compound (2), 0 to 200 parts of compound (c), 0 to 5 parts of compound (d) and 0 to 20 parts (all by weight) of compound (e). In some instances compound (a) may also serve as compound (e).

The photopolymerizable elements of this invention comprise a support bearing a layer as defined above.

In making the photopolymerizable compositions, constituents (a), (b)(1) and (b)(2) are admixed to form a uniform mixture and constituents (c), (d) and (e) blended therewith in any order and at any stage in forming the desired complete uniform composition.

A suitable inert solvent or diluent can be added and the resulting fluid mixture coated on any suitable support to form a layer which is then dried to remove the solvent or diluent.

Organic bromine donor or labile bromine compounds useful in the composition and layers include bromoform, carbon tetrabromide (the preferred donor compound), bromotrichloromethane, 1,1,2,2 tetrabromoethane, pentabromochloroethane pentachlorobromoethane, hexabromoethane, 3-bromopropionitrile, tribromoacetic acid, 2-bromo-2-phenylacetophenone, 4-bromo-N,N-dimethylaniline, N-(2-bromoethyl)phthalimide, N-(bromopropyl) phthalimide, 6-bromopiperonal, bromosuccinimide, and mixtures of any two or more of said compounds.

The hydrogen atom donor may be provided by the ethylenically unsaturated compound when that compound is of the type $$\mathrm{R{-}O{-}\overset{\displaystyle O}{\overset{\|}{C}}{-}\underset{\displaystyle R''}{\underset{|}{C}}{=}CH{-}R'}$$

where R, R′, and R″, which may be the same or different, have at least one labile hydrogen atom and are selected from hydrogen, alkyl, substituted alkyl, or alkoxy. For example, the hydrogen atom donor may be triethylene glycol diacrylate, lauryl methacrylate, etc. When the hydrogen atom donor is a separate ingredient, suitable compounds include alkyl or alkoxy alcohols, ethers, aldehydes, ketones, carboxylic acids, esters, amines, and amides; i.e., a non-monomeric material containing an abstractable hydrogen atom.

Suitable sensitizing dyes are described below and suitable amine reducing agents are the monoalkyl, dialkyl and trialkylamines wherein the alkyl radicals contain 1 to 6 carbon atoms, inclusive, e.g., triethylamine, dibutylamine and trihexylamine; alkylenediamines of 1 to 4 carbon atoms, e.g., ethylenediamine; alkanolamines, e.g., ethanolamine, diethanolamine and triethanolamine; and the aliphatic polyamines disclosed in Chambers and Oberth U.S.P. 3,026,203, Mar. 20, 1962.

Suitable monomethine and polymethine dyes that can be used alone or with one or other such dyes are shown below in the examples.

The fluid photopolymerizable compositions, for example, may be coated at a dry thickness of about .0005 to about .075 inch, on a suitable support to provide photopolymerizable elements. Suitable base or support materials include metals, e.g., steel and aluminum plates, sheets and foils, and films or plates composed of various film-forming synthetic resins or high polymers. Suitable resins or polymers include the addition polymers such as the vinylidene polymers and vinylidene copolymers, e.g., vinylidene chloride copolymerized with vinyl chloride, vinyl acetate, styrene, isobutylene and acrylonitrile; and vinylchloride polymers and copolymers, e.g., vinyl chloride copolymerized with the above polymerizable monomers; the linear condensation polymers such as the polyesters, e.g., polyethylene terephthalate; the polyamides, e.g., polyhexamethylene sebacamide; polyester amides, e.g., polyhexamethylene-adipamide/adipate; etc. Fillers or reinforcing agents can be present in the synthetic resin or polymer bases such as the various fibers (synthetic, modified, or natural), e.g., cellulosic fibers, for instance, cotton, cellulose acetate, viscose rayon, paper; glass wool; nylon, and the like. These reinforced bases may be used in laminated form.

The photopolymerizable elements of this invention can be provided with antihalation layers, anchor or adhesive layers and/or protective layers which act to inhibit atmospheric oxygen from entering the photopolymerizable stratum since oxygen is known to retard the polymerization reaction. Such an oxygen impermeable layer may be a separate stratum, e.g., a laminated, removable sheet of an oxygen impermeable, transparent plastic such as polyethylene terephthalate as disclosed in U.S. 3,060,026 or a wax overcoating as disclosed in assignee's application, Burg S.N. 234,214 filed Oct. 30, 1962 (U.S.P. 3,203,805, Aug. 31, 1965).

The invention will be further illustrated but is not intended to be limited by the following examples.

EXAMPLE I

The following solution was prepared in the absence of significant actinic radiation (under safelights):

| | G. |
|---|---|
| Cellulose acetate butyrate | 20.00 |
| Triethylene glycol diacrylate | 10.00 |
| 9,10-phenanthrenequinone | 0.01 |
| Carbon tetrabromide | 0.10 |

The above ingredients were mixed in a suitable container with slow stirring for 30 minutes at 25° C., then brought up to a weight of 75 g. with ethanol. This solution was coated to a dry thickness of 0.006 inch on an aluminum plate 1/32 inch in thickness. The dried coating was placed under vacuum and exposed imagewise by projection with a 300-watt tungsten filament lamp at a distance of 12 inches for 20 seconds. The exposed plate was then spray washed with an aqueous alkaline solution to remove the unexposed (unpolymerized) areas and thereby leave a relief image of photopolymer on the plate.

A control coating, in which the $CBr_4$ was omitted, was so much slower that, after a one-minute exposure of equivalent intensity, there was no observable imagewise polymerization and no relief was formed by spray washing with the alkaline solution.

EXAMPLE I–A

A number of bromine donor compounds capable of forming free-radicals were qualitatively examined in test tubes by mixing 50 mg. of the bromine donor with about 4 ml. of pentaerthritol triacrylate, 5–6 drops of triethylamine and 10 mg. of Dye No. 18 of Example VI. The mixture was exposed for periods up to about one minute as in Example I. In all cases a visible reaction indicated that polymerization occurred, i.e., the liquid became more viscous and in some cases a solid began to form. The following bromine donor compounds were thus found to be useful in accordance with the present invention:

1,3-dibromo-5,5-dimethyl hydantoin
Tribromoacetic acid
Pentabromoethane
Hexabromoethane
α,α-Dibromoacetophenone
p-α,α-Tribromoacetophenone
α,α,α-Tribromoacetophenone
Bromotrichloromethane
2-bromodiethylmalonate
m-Nitro-α,α,α-tribromoacetophenone
α,α-Bis(α-bromoacetophenone)

EXAMPLE II

The procedure of Example I was repeated except for the addition of 0.05 g. triethanolamine to the composition and reduction of exposure time to 5 seconds. A similar relief image was formed.

EXAMPLE III

The following ingredients were mixed and coated as described in Example I, again using ethanol to adjust the solutiton weight up to 75 g.

| | G. |
|---|---|
| Cellulose acetate butyrate | 20.00 |
| Pentaerythritol triacrylate | 10.00 |
| Benzoin methyl ether | 0.01 |
| Carbon tetrabromide | 0.10 |

An exposure of 30 seconds with a 100-watt medium pressure mercury arc at an exposure distance of 12 inches, followed by processing as in Example I, yielded a similar relief image.

EXAMPLE IV

Example III was repeated except for the addition of 1 gram of dimethoxy tetraethylene glycol. The required exposure time was 15 seconds to obtain a relief image.

EXAMPLE V

Example I was essentially repeated except for the replacement of the 0.1 g. of carbon tetrabromide by 0.2 g. of bromoform and doubling the exposure time to 40 seconds. The resultant relief image was very similar to that obtained in Example I.

EXAMPLE VI

Cyanine optical sensitizing dyes, as used to extend the spectral sensitivity of silver halide photographic emulsions, have been found to serve very effectively as ingredient (b)(1) of the photopolymerizable composition of this invention, i.e., as that component of the polymerization initiating system capable of absorbing actinic radiation. Particularly effective are the merocyanine, carbocyanine and dicarbocyanine dyes. After absorbing actinic radiation the dye forms a species capable of reacting with a bromine atom donor such as $CBr_4$ to produce the polymerization initiating free radicals.

A number of optical sensitizing dyes were shown to be useful when tested in photopolymerizable compositions. A stock solution was prepared by stirring the following ingredients, in the proportions indicated, for two hours at room temperature:

| | | |
|---|---|---|
| Cellulose acetate butyrate[1] | g. | 0.14 |
| Cellulose acetate[2] | g. | 0.09 |
| Pentaerythritol triacrylate | g. | 0.45 |
| Polyethylene glycol, mol. wt. 4000 | g. | 0.02 |
| Methanol | ml. | 0.50 |
| Acetone to | g. | 2.75 |

[1] Contained ca. 20.5% acetyl groups, ca. 26% butyryl groups and had a viscosity of 56 to 131 poises determined by ASTM method D–1343–54T in solution described as Formula A, ASTM method D–871–54T.

[2] Combined acetic number of ca. 55 and a viscosity of 147–197 poises as determined by ASTM methods D–1343–56 in the solution described as Formula A, ASTM method D–871–56.

To 2.5 g. of this stock solution there were added, with stirring, 5.0 mg. of an optical sensitizing dye and 1.0 ml. of an acetone solution containing 0.1 g. of $CBr_4$. The solution was then brought up to a weight of 5.0 g. with acetone and coated on a suitably subbed 0.001-inch thick polyethylene terephthalate support using a doctor knife set at 0.006 inch. After 30 minutes drying at room temperature, the coating was laminated with another 0.001-inch thick sheet of polyethylene terephthalate film.

Exposures of a sample of the laminated film were made to a 220 v., 70 amps. standing carbon arc, at a distance of 16 inches. The matrix sample was mounted in a glass walled printing frame behind a $$\sqrt[6]{2}$$

sensitometric stepwedge with the laminated side facing the arc.

The exposed matrix samples were developed by thermal transfer. The delaminated sample was placed face down on the receptor sheet and the "sandwich" was passed through a pair of hot rolls (125° C., exerting a pressure of 3 lb./lineal inch). The non-polymerized areas transferred to the receptor sheet while the polymerized areas stayed on the original polyethylene terephthalate base.

The amount of exposure required to prevent thermal transfer was a basis for comparing the speed of the photopolymer coatings.

The relative minimum exposure was defined as $$I' \times t(\text{sec.})$$

where I' is the light intensity that caused polymerization in $t$ sec. The light attenuation through the sensitometric stepwedge was expressed as $$\log I' = \log I - D$$

where I is the light intensity of the carbon arc, arbitrarily called 100, and D is the density of the wedge at the transfer/no transfer step of the thermal transfer development. So $$I' = \text{antilog } (2 - .05n)$$

$n$ being the number of steps polymerized and .05 the density difference between any two consecutive steps of the wedge.

The relative minimum exposure required to initiate polymerization (product of I'×time in seconds) is tabulated for a number of coatings which vary only in the particular optical sensitizing dye employed under the above tests conditions. A small value of relative minimum exposure indicates a high sensitivity to actinic radiation. In Table I below the dyes tested are listed according to structural formula, wavelength in millimicrons of maximum absorption (in ethanol solution), and relative minimum exposure as determined in the above test.

TABLE I.—CYANINE DYES

| Dye number | Structure | $\lambda_{max.}$ mμ | Sensitivity | Relative minimum exposure |
|---|---|---|---|---|
| 1 | 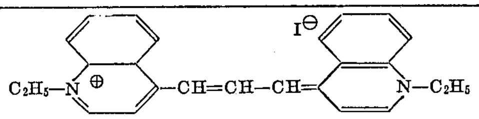 | 706 | Infrared | 56.0 |
| 2 | 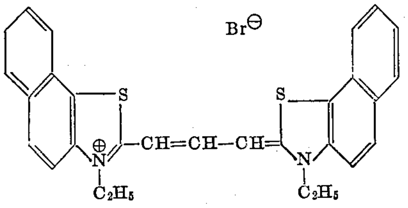 | 560, 603 | Red | 3.6 |
| 3 | 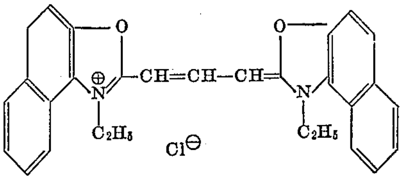 | 395, 515 | Blue and green | 44.0 |
| 4 | 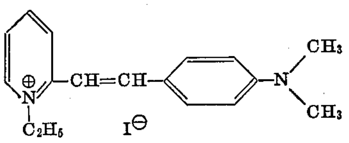 | 465 | do | 399.0 |
| 5 | 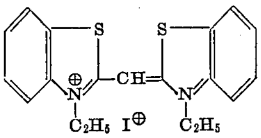 | 430 | Blue | 795.0 |
| 6 | 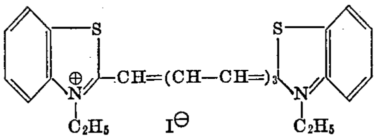 | 653 | Red | 1,065.0 |

TABLE I.—CYANINE DYES—Continued
| | Structure | λ max. mμ | Sensitivity | Relative minimum exposure |
|---|---|---|---|---|
| 7 | 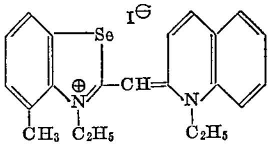 | 494 | Green | 252.0 |
| 8 | 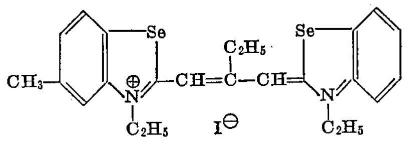 | 665 | Red | 3.6 |
| 9 | 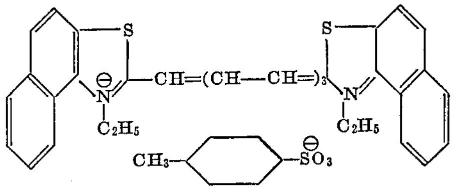 | 800 | Infrared | 795.0 |
| 10 | 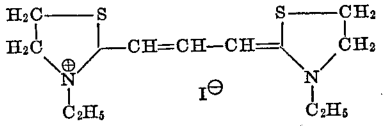 | 445 | Blue | 141.0 |
| 11 | 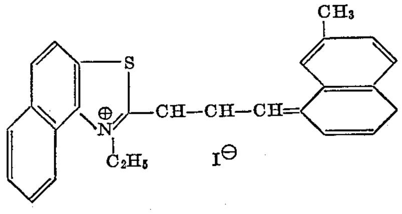 | 615, 655 | Red | 10.3 |
| 12 | 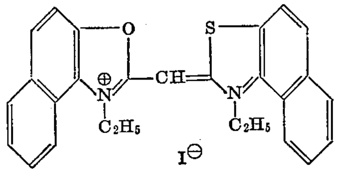 | 405, 425 | Blue | 70.8 |
| 13 | 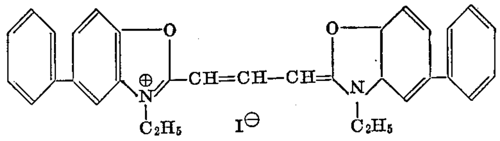 | 475, 500 | Green | 142.0 |
| 14 | 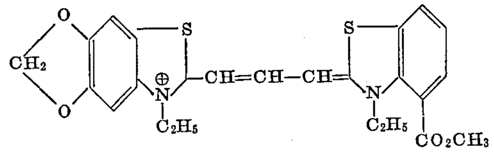 | 570 | do | 56.5 |
| 15 | 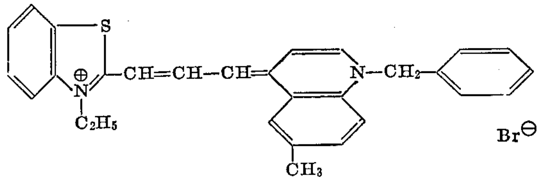 | 640 | Red | 3.1 |
| 16 | 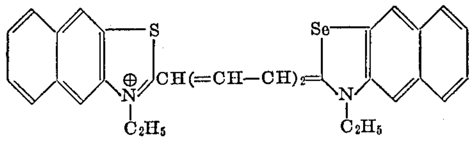 | 680 | Infrared | 3.6 |

TABLE I.—CYANINE DYES—Continued

| Structure | $\lambda_{max.}$ mμ | Sensitivity | Relative minimum exposure |
|---|---|---|---|
| 17 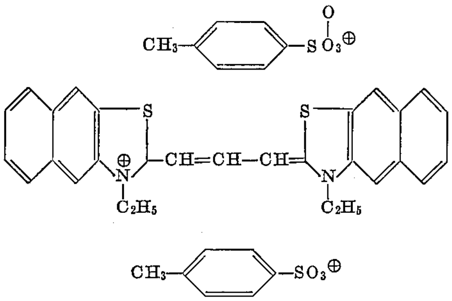 | 580 | Pan red | 8.9 |
| 18 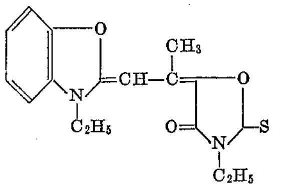 | 465 | Blue-green | 8.0 |
| 19 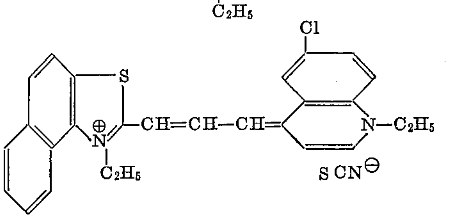 | 671 | Red | 63.1 |

EXAMPLE VII

The photoreducible dye, erythrosin, was found to be useful in absorbing the actinic radiation required for photopolymerization when tested according to the procedure described in Example VI, i.e., by substituting 5 mg. of erythrosin for the cyanine optical sensitizing dye. This dye was most effective in absorbing green light, $\lambda_{max.}$ being 535 millimicrons. The relative minimum exposure, as defined in Example VI, was 17.8.

EXAMPLE VIII

Additivity of spectral response and the expected increase in photospeed has been found to result when two or more dyes are combined. Thus the procedure of Example VI was repeated in separate coatings using 5 mg. of the following two dyes:

| Structure | $\lambda_{max.}$ |
|---|---|
| Dye No. 18 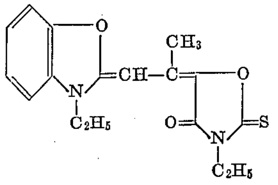 | 465 |
| Dye No. 19 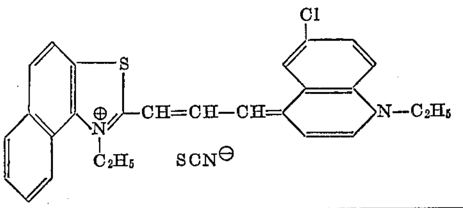 | 671 |

The relative minimum exposures of the two coatings were 17.8 and 63.1 for Dye No. 18 and Dye No. 19, respectively. Another coating, containing 5 mg. of both of these dyes, had a relative minimum exposure of 8.9 and was found to be sensitive to both blue and red light.

Panchromatic sensitization, i.e., sensitivity to blue, green and red light, or the full exploitation of the spectral energy available in white light, was achieved by coating a similar composition which contained 5 mg. each of Dye No. 18, Dye No. 19, and the green sensitive dye of Example VII, erythrosin. For this coating, the relative minimum exposure was 7.1.

Panchromatic sensitization was also achieved in a similar coating in which phenanthrenequinone, instead of Dye No. 18, was used to absorb blue light. This coating was sensitive enough to be used as a "projection speed" material, e.g., a satisfactory 8× enlargement was obtained by exposing through a transparency for 20 seconds using a commercial 500-watt tungsten projector. The individual dye concentrations were varied to take account of their different sensitivities in an attempt to obtain as nearly as possible a uniform color absorption over the entire visible spectrum.

EXAMPLE IX

Under safelight conditions, ten-milliliter portions of a stock solution of the composition described in Example VI were measured into a number of small bottles. To each bottle there were then added 10 mg. of erythrosin, an amount of a bromine atom donor as stipulated below, and 5 ml. of acetone. After a thorough mixing of these ingredients, the compositions, were coated, dried and exposed through a $$\sqrt[6]{2}$$

sensitometric stepwedge as described in Example VI, employing a 5-second exposure for each sample. The relative photospeeds of the coatings were obtained by noting the number of steps in which a decrease of density could be determined by visual observation. Since a $$\sqrt[6]{2}$$

stepwedge was used to expose the films, it can be seen, for example, that Coating No. 3 is twice as sensitive to the exposing radiation as Coating No. 4 since a visible image appeared in 6 more steps of the former coating than of the latter.

| Coating No. | Bromine Atom Donor | Donor concentration, mg. | No. of visible steps in image |
|---|---|---|---|
| 1 | $CBr_4$ | 10.0 | 6 |
| 2 | 4-Br-N,N-dimethylaniline | 100 | 6 |
| 3 | N-(2-Br-ethyl)phthalimide | 100 | 8 |
| 4 | N-($\gamma$-Bromo-propyl)phthalimide | 100 | 2 |
| 5 | 6-Br-piperonal | 100 | 20 |
| | 4-Br-N,N-dimethylaniline | 200 | |
| 6 | N-bromosuccinimide | 100 | 2 |

Suitable free radical initiated, chain-propagating, addition polymerizable, ethylenically unsaturated compounds include preferably an alkylene or a polyalkylene glycol diacrylate prepared from an alkylene glycol of 2 to 15 carbons or a polyalkylene ether glycol of 1 to 10 ether linkages, and those disclosed in Martin & Barney U.S. Patent 2,927,022, issued Mar. 1, 1960, e.g., those having a plurality of addition polymerizable ethylenic linkages, when present as terminal linkages, and especially those wherein at least one and preferably most of such linkages are conjugated with a doubly bonded carbon including carbon doubly bonded to carbon and to such hetero atoms as nitrogen and oxygen. Outstanding are such materials wherein the ethylenically unsaturated groups are conjugated with ester, amide, or nitrile structures. The following specific compounds are further illustrative of this class: unsaturated esters of alcohols, preferably polyols, and particularly such esters of the alpha-methylene carboxylic acids, e.g., ethylene diacrylate, diethylene glycol diacrylate, glycerol triacrylate, ethylene dimethacrylate, 1,2,4 - butanetriol trimethacrylate, 1,4 - cyclohexanediol diacrylate, pentaerythritol tri- and tetramethacrylate, pentaerythritol tri- and tetraacrylate, dipentaerythritol hexacrylate, tripentaerythritol octaacrylate, mannitol hexacrylate, sorbitol hexacrylate, inositol hexacrylate and the corresponding methacrylates, the bis-acrylates and methacrylates of polyethylene glycols of molecular weight 200–1500, and the like; unsaturated amides, particularly those of the alpha-methylene carboxylic acids, and especially those of alpha, omega-diamines and oxygen-interrupted omega-diamines, such as methylene bis-acrylamide, methylene bis-methacrylamide, ethylene bis-methacrylamide, 1,6 - hexamethylene bis - acrylamide, diethylene triamine tris - methacrylamide, bis(gamma - methacrylamidopropoxy)ethane, beta - methacrylamidoethyl methacrylate, N - beta - hydroxyethyl - beta - (methacrylamido) ethyl acrylate, N,N - bis(beta - methacrylyloxyethyl)acrylamide and acrylonitrile.

An outstanding class of these preferred addition polymerizable components are the esters and amides of alphamethylene carboxylic acids and substituted carboxylic acids with polyols and polyamines wherein the molecular chain between the hydroxyls and amino groups is solely carbon or oxygen-interrupted carbon. The preferred monomeric compounds are multifunctional, but monofunctional monomers can be used. The ethylenic unsaturation can also be present as an extralinear substituent attached to a linear polymer, such as polyvinyl acetate/acrylate, N-acryloxymethylpolyamide, allyloxymethylpolyamide, etc., in which case monomer and polymer functions are combined in a single material. In assignee's copending application of Schoenthaler, Ser. No. 451,300, filed Apr. 27, 1965, now Patent No. 3,418,295, there are disclosed particularly useful polymeric acrylic and methacrylic esters which may be further polymerized. Still other suitable addition polymerizable components are the polymerizable dye intermediates and dye forming compounds disclosed by J. C. Firestine in U.S. Patent Nos. 2,976,294 and 3,073,699, issued Mar. 21, 1961 and Jan. 15, 1963, respectively.

Suitable radiation-sensitive compounds, [constituent (b)(1)], that are activatable by actinic light and thermally inactive below 185° C. include the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-ethylanthraquinone,2-tert-butylanthraquinone, 1,4-naphthoquinone, 9,10-phenanthrenequinone, 1,2-benzanthraquinone, 1,4-dimethylanthraquinone, 2-phenylanthraquinone, sodium salt of anthraquinone alpha-sulfonic acid, retenequinone, 1,2,3,4-tetrahydrobenz-(a) anthracene-7,12-dione and azo initiators. Also useful are certain aromatic ketones, e.g., benzoin and acyloin ethers, e.g., benzoin methyl ethers.

Certain chlorine atom donors, e.g., trichloroacetic acid, hexachloroethane, 1,3-dichlorobutene-2 can be used with the bromine donors of this invention.

Suitable thermoplastic organic binders for constituent (3) include copolyesters, polyamides, vinylidene chloride copolymers, cellulose esters, etc., as disclosed more fully in Burg and Cohen, U.S. Patent 3,060,023, Oct. 23, 1962.

If desired, the photopolymerizable composition may also contain immiscible polymeric or nonpolymeric organic or inorganic fillers or reinforcing agents which are essentially transparent at the wavelengths used for imagewise exposure, e.g., the organophilic silicas, bentonites, silica, powdered glass, etc.

The photopolymerizable stratum may include dyes which function only as coloring materials, i.e., as opposed to dyes which are used in initiating the polymerization. The stratum may also include suitable pigments, e.g., $TiO_2$, colloidal carbon, graphite, phosphor particles, ceramics, clays, metal powders such as aluminum, copper, magnetic iron and bronze, which should not destroy the required properties of the polymeric system. The pigments are useful when placed in the photosensitive layer or in an adjacent non-photosensitive layer.

Exposure of the element may be effected through a halftone image or a process transparency, e.g., a process negative or positive (an image-bearing transparency consisting solely of substantially opaque and substantially transparent areas where the opaque areas are substantially of the same optical density, the so-called line or halftone negative or positive) or through a continuous tone negative or positive. The image or transparency may or may not be in operative contact with the layer, e.g., contact exposure or projection exposure. It is possible to expose through paper or other light-transmitting materials. A stronger radiation source or longer exposure time must be used, however.

Reflex exposure techniques are especially useful in the present invention, particularly when office copies are made. By using reflex exposure, copies can be made from materials having messages on both sides of a page or from opaque supports, e.g., paper, cardboard, metal, etc., as well as from poor light-transmitting surfaces. Right reading copies having excellent resolution are obtained directly on transfer.

The exposure sources should furnish an effective amount of radiation in the spectral region corresponding to the maximum sensitivity of the free-radical-generating addition polymerization initiator. Many of the available light sources emit radiation in both the ultraviolet and the visible region of the spectrum but it is the emission in the latter region which is of more particular interest. Suitable sources include fluorescent lamps, particularly those with visible light-emitting phosphors, tungsten lamps, carbon arcs, mercury-vapor arcs, argon glow lamps, electronic flash units, photographic flood lamps and sunlight.

The photopolymerizable compositions of this invention are useful in a variety of manners, but especially wherever increased sensitivity to actinic light is desirable. Elements prepared from these compositions may be used in the field of office copying as disclosed in U.S. Patents 3,060,023, –024, –025, and –026 (being particularly useful for reflex exposure wherein greater sensitivity is required than for direct exposure). Also elements may be prepared which are useful for printing plates (as in U.S. 2,791,504), projection printing, photopolymerizable resists, and various other image forming systems.

The main advantage of the present compositions is their increased rate of polymerization following exposure to actinic radiation. The rate of thermal polymerization is also increased. Although the monomer polymerizes much more rapidly in these compositions which contain a bromine atom donor than in previous compositions, the resultant polymer appears to have the same physical properties as a polymer mass where no bromine atom donor was employed. That is, hard, optically clear polymers may be produced according to the procedure of the present invention. Another advantage of these compositions is the shift of response to longer wavelength radiation.

The photopolymerizable layers and elements of this invention have the particular advantage that they may be pan-sensitized, i.e., sensitive to radiation over essentially the whole visible spectrum. The speed of such a pan-sensitive system appears to be the sum of the speeds obtained from the individual dyes; thus the system represents the ideal exploitation of all the spectral energy available for initiators during exposure with visible light. A correct selection of dyes will not only give high speeds, but neutral image colors over the entire visible spectrum as well.

I claim:

1. A photopolymerizable composition comprising
(a) an addition polymerizable ethylenically unsaturated acrylate or methacrylate compound having at least one terminal ethylenic group attached to a carbon atom of said compound, having a boiling point above 100° C. at normal atmospheric pressure, and being capable of forming a high polymer by photoinitiated addition polymerization, and
(b) an addition polymerization initiating combination of
(1) a photographic silver halide optical sensitizing monomethine or polymethine cyanine dye having a monomethine or polymethine radical between two heterocyclic nitrogen nuclei of the type contained in cyanine dyes, and
(2) an organic bromine donor compound that produces free radicals upon being initiated by said radiation-sensitive compound.

2. A composition according to claim 1 containing at least one of the following adjuvants:
(c) a polymeric organic binding agent that forms solid, coherent films,
(d) a normally liquid or solid amine reducing agent, and
(e) a hydrogen donor compound.

3. A composition according to claim 1, wherein said dye is a carbocyanine dye.

4. A composition according to claim 1, wherein for every 100 parts of compound (a) there are present 0.01 to 10 parts of compound (1), 0.1 to 10 parts of compound (2), 0 to 200 parts of compound (c), 0 to 5 parts of compound (d), and 0 to 20 parts (all by weight) of compound (e).

5. A composition according to claim 1, wherein constituent (2) is $CBr_4$.

6. A composition according to claim 4 where constituent (2) is $CBr_4$.

7. A photopolymerizable composition according to claim 1 in the form of a layer.

8. A photopolymerizable element comprising a sheet support bearing a layer of a photopolymerizable composition as defined in claim 1.

9. An element according to claim 8 where constituent (2) is $CBr_4$.

References Cited

UNITED STATES PATENTS

| | | | |
|---|---|---|---|
| 2,666,701 | 6/1954 | West | 96—35.1 XR |
| 2,940,952 | 6/1960 | Miller | 96—115 XR |
| 3,218,167 | 11/1965 | Burg et al. | 96—35.1 XR |
| 1,587,274 | 6/1926 | Beebe et al. | 96—115 |
| 3,099,558 | 7/1963 | Levinos | 96—35 |
| 3,042,517 | 7/1962 | Wainer | 96—48 |
| 3,042,518 | 7/1962 | Wainer | 96—48 |
| 3,056,673 | 10/1962 | Wainer | 96—48 |
| 3,231,378 | 1/1966 | Silver | 96—33 |
| 3,359,105 | 12/1967 | Wainer | 96—48 |
| 3,361,563 | 1/1968 | Hackmann | 96—48 |
| 3,374,094 | 3/1968 | Wainer et al. | 96—33 |
| 3,418,118 | 12/1968 | Thommes et al. | 96—11 |

OTHER REFERENCES

Improving the Efficiency and Spectral Response of Free Radical Photograhpy, Horizons Inc., ASD–TDR–63–117, AD298038, February 1963, TR 210 H58.

Photopolymerization Induced by Metal Salts: 1. Silver Salt Catalysts, Levinos & Mueller, Photographic Science and Engineering, vol. 6, No. 4, July-August 1962.

RONALD H. SMITH, Primary Examiner

U.S. Cl. X.R.

96—35.1; 204—159.15